(12) United States Patent
Babu et al.

(10) Patent No.: US 7,723,234 B2
(45) Date of Patent: May 25, 2010

(54) METHOD FOR SELECTIVE CMP OF POLYSILICON

(75) Inventors: Suryadevara V. Babu, Potsdam, NY (US); Anita Natarajan, Potsdam, NY (US); Sharath Hegde, Portland, OR (US)

(73) Assignees: Clarkson University, Potsdam, NY (US); Infotonics Technology Center Inc., Canandaigua, NY (US)

( * ) Notice: Subject to any disclaimer, the term of this patent is extended or adjusted under 35 U.S.C. 154(b) by 0 days.

(21) Appl. No.: 11/562,443

(22) Filed: Nov. 22, 2006

(65) Prior Publication Data

US 2008/0119051 A1 May 22, 2008

(51) Int. Cl.
*H01L 21/302* (2006.01)
(52) U.S. Cl. .................. 438/693; 438/691; 438/692; 216/89
(58) Field of Classification Search ............ 438/692, 438/693, 694, 691, 690; 451/41, 80; 216/88, 216/89, 99
See application file for complete search history.

(56) References Cited

U.S. PATENT DOCUMENTS

| | | | |
|---|---|---|---|
| 6,436,834 B1 | 8/2002 | Lee et al. | |
| 6,491,843 B1 | 12/2002 | Srinivasan et al. | |
| 6,527,818 B2 * | 3/2003 | Hattori et al. | 51/308 |
| 6,533,832 B2 | 3/2003 | Steckenrider et al. | |
| 6,544,892 B2 | 4/2003 | Srinivasan et al. | |
| 6,702,954 B1 | 3/2004 | Her et al. | |
| 6,896,590 B2 * | 5/2005 | Minamihaba et al. | 451/41 |
| 7,005,382 B2 | 2/2006 | Nishimoto et al. | |
| 7,101,800 B2 * | 9/2006 | Her et al. | 438/692 |
| 2003/0124850 A1 * | 7/2003 | Minamihaba et al. | 438/689 |
| 2003/0176151 A1 * | 9/2003 | Tam et al. | 451/41 |
| 2004/0132305 A1 | 7/2004 | Nishimoto et al. | |
| 2004/0152309 A1 | 8/2004 | Carter et al. | |
| 2004/0186206 A1 | 9/2004 | Yoneda et al. | |
| 2005/0028450 A1 | 2/2005 | Xu et al. | |
| 2005/0136673 A1 | 6/2005 | Xu et al. | |
| 2006/0113283 A1 * | 6/2006 | Yoneda et al. | 216/88 |
| 2006/0143993 A1 * | 7/2006 | Kim et al. | 51/307 |
| 2006/0281196 A1 * | 12/2006 | Feeney et al. | 438/5 |

OTHER PUBLICATIONS

Commonly Owned U.S. Appl. No. 11/562,453, filed Nov. 22, 2006.
Commonly Owned U.S. Appl. No. 11/562,447, filed Nov. 22, 2006.
Natarajan, Anita; Hedge, Sharath; and Babu, S.V.; Selective chemical-mechanical planarization of polysilicon during fabrication of MEMS devices; poster; Mar. 28, 2005; exhibited during the Materials Research Society Spring Meeting in San Francisco, California.

(Continued)

*Primary Examiner*—Lan Vinh
(74) *Attorney, Agent, or Firm*—Rankin Hill & Clark LLP

(57) ABSTRACT

A method of removing polysilicon in preference to silicon dioxide and/or silicon nitride by chemical mechanical polishing. The method removes polysilicon from a surface at a high removal rate while maintaining a high selectivity of polysilicon to silicon dioxide and/or a polysilicon to silicon nitride. The method is particularly suitable for use in the fabrication of MEMS devices.

16 Claims, 1 Drawing Sheet

OTHER PUBLICATIONS

Carter, Philip W.; and Johns, Timothy P.; Interfacial Reactivity Between Ceria and Silicon Dioxide and Silicon Nitride Surfaces, Organic Additive Effects; Electrochemical and Solid-State Letters, 8 G218-G221 (2005); The Electrochemical Society, Inc.

Anjur, Sriram; Dysard, Jeffrey; Feeney; Paul; Johns, Timothy; Kason, Mark; Perez, Maria; and Romine, Richard; Selective Silicon Nitride Polishing; presentation paper; Oct. 10, 2006; 2006 International Conference on Planarization/CMP Technology; Foster City, California.

Kim, Sang-Kyun; Sohn, Hyung-Min; Paik, Ungyu; Katoh, Takeo; and Park, Jea-Gun, A Reverse Selectivity Ceria Slurry for the Damascene Gate Chemical Mechanical Planarization Process; Japanese Journal of Applied Physics, vol. 43, Nol. 11A, 2004, pp. 7434-7438; The Japan Society of Applied Physics.

\* cited by examiner

METHOD FOR SELECTIVE CMP OF POLYSILICON

The U.S. Government has a paid-up license in this invention and the right in limited circumstances to require the patent owner to license others on reasonable terms as provided for by the terms of Grant No. NAG3-2744 awarded by NASA. The Government has certain rights in the invention.

BACKGROUND OF THE INVENTION

1. Field of Invention

The present invention relates to compositions and methods for selectively removing polysilicon in preference to silicon dioxide and/or silicon nitride by chemical-mechanical polishing.

2. Description of Related Art

Chemical-mechanical polishing (CMP) is an enabling technology for the manufacturing of multi-level interconnects in integrated circuit (IC) fabrication. It is also becoming an enabling technology in the development of and manufacturing of micro-electro-mechanical devices (MEMS) and micro-opto-electro-mechanical devices (MOEMS). Like IC devices, multilevel structures have been widely used in MEMS devices (e.g., micro engines, pressure sensors, micro mirrors, micro lenses etc.). These devices contain moving parts within the multi-level structures, and planarity at each level becomes important. As layers of polysilicon and silicon dioxide are deposited and etched during successive steps in the device fabrication process, considerable uneven topography arises which imposes limitations in subsequent processes like patterning, deposition and etching. Specifically, to minimize the processing difficulties related to photoresist step coverage and depth of focus during photolithography, it is desirable to planarize each deposited layer using CMP.

An important feature of a MEMS multilevel structure that differentiates it from a typical IC, from a CMP perspective, is the large step height that needs to be worked with during MEMS fabrication. Structures on a single level in MEMS (polysilicon/silicon dioxide) typically have a step height of $\geqq 5$ microns, which is relatively large when compared to the $\leqq 1$ micron step height typical in IC fabrication. Thus, due to the large step height associated with the fabrication of MEMS devices, development of a robust CMP process faces several challenges. In addition, in several polishing steps during the device fabrication sequence, selective polishing of the top layer over the underlying layer is required. One such step involves polishing a few microns thick polysilicon film deposited in a silicon dioxide trench with or without silicon nitride. Hence, a slurry that selectively removes polysilicon over underlying silicon dioxide or silicon nitride is critical to prevent erosion of silicon dioxide and/or silicon nitride, which could be detrimental to subsequent fabrication steps.

The composition of the polishing slurry is one of the important factors in a CMP process. A typical CMP slurry includes abrasive particles and chemicals that serve as mechanical and chemical agents, respectively. Two of the important requirements for an acceptable slurry for the CMP of polysilicon in MEMS fabrication are: (1) a high (e.g., $\geqq 200$ nm/min) polish and/or planarization rate for the polysilicon film; and (2) a high polish rate selectivity (e.g., $\geqq 50$) of polysilicon to the underlying stop layer (e.g., silicon dioxide and/or silicon nitride). High polysilicon polish rates lead to short polishing times, whereas high polish rate selectivity minimize the erosion of the underlying material, thereby protecting the underlying devices. Hence, a CMP slurry and method that provide very high polysilicon polish rates and high polish rate selectivity for polysilicon with respect to underlying materials during MEMS device fabrication is highly desirable.

SUMMARY OF INVENTION

The present invention provides a method of removing polysilicon in preference to silicon dioxide and/or silicon nitride by chemical mechanical polishing. The method removes polysilicon from a surface at a high removal rate, for example, at a removal rate of 200 nm/min or greater while maintaining a high selectivity of polysilicon to silicon dioxide selectivity and/or a polysilicon to silicon nitride, for example a selectivity of 50 or greater. The method is particularly suitable for use in the fabrication of MEMS devices.

The method utilizes a polishing slurry having a pH of from about 8 to about 11 that includes colloidal silica abrasive particles or calcined ceria ($CeO_2$) abrasive particles dispersed in water and an additive compound, wherein the additive compound includes an organic compound containing an alpha-amino acid functional group and an additional functional group, wherein the additional functional group includes an amino group or a guanidine group. In one embodiment the additive compound is selected from the group consisting of arginine, lysine and lysine monohydrochloride. The additive becomes adsorbed on the abrasive particles and the silicon dioxide and/or silicon nitride surfaces causing electrostatic repulsion, which results in the suppression of the silicon dioxide and/or silicon nitride removal.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

BRIEF DESCRIPTION OF THE DRAWING FIGURES

DETAILED DESCRIPTION OF THE PREFERRED EMBODIMENTS

Figure 1:
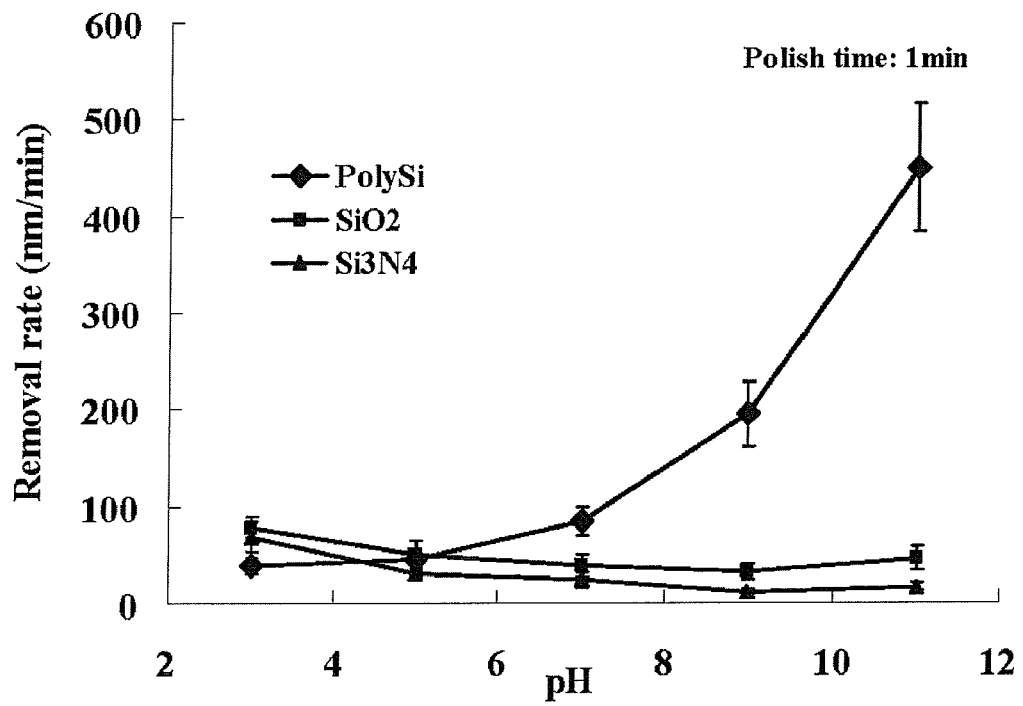
FIG. 1 is a graph showing the removal rate of blanket films using a comparative silica CMP slurry as a function of pH.

The method of the present invention comprises disposing a polishing slurry between a polishing pad and a surface comprising polysilicon, and pressing the polishing pad and the surface into contact with each other while the polishing pad and surface are moving relative to each other with the polishing slurry disposed therebetween to remove polysilicon from the surface at a high removal rate.

In one embodiment, the high removal rate is about 100 nm/min or greater, desirably 150 nm/min or greater, and preferably 200 nm/min or greater. Polysilicon is removed while maintaining a high selectivity ratio of polysilicon to silicon dioxide (sometimes referred to as "$SiO_2$") selectivity and/or a polysilicon to silicon nitride (sometimes referred to as "$Si_3N_4$"). In one embodiment, the selectivity ratio is 30 or greater, desirably 40 or greater, and preferably 50 or greater.

The polysilicon can be in the form of a surface film. Alternatively, the polysilicon can be a surface structure formed during the fabrication of a MEMS device. Another aspect of the invention includes a device including silicon, for example a device including silicon dioxide or silicon nitride, fabricated by the methods of the present invention. Examples of useful devices include integrated circuits, micro-electro-mechanical devices, and micro-opto-electro-mechanical (MEMS) devices.

The composition of the polishing pad and the polishing conditions used are not per se critical. Conventional polishing apparatus and conditions typically employed to remove film layers from surfaces via CMP can be used.

To achieve the desired polysilicon removal rate at the desired selectivity, a polishing slurry comprising colloidal silica abrasive particles or calcined ceria abrasive particles dispersed in water and an additive compound. Desirable additive compounds include organic compounds containing an alpha-amino carboxylic acid functional group and an additional functional group, wherein the additional functional group comprises an amino group or a guanidine group.

Organic compounds that have an amino group and an acid group attached to the same carbon are referred to as alpha-amino carboxylic acids. Many alpha-amino carboxylic acid compounds are known and there are twenty "natural" amino acids, that is, amino acids that are used as basic components of proteins in living organisms.

In addition to an amino acid functional group, desirable additive compounds have an additional functional group, which can be protonated and consequently can acquire a positive charge. Useful functional groups include amino groups and guanidine groups. In particular, primary amino groups having a pKa of about 9.0 or greater are desirable.

An example of a compound having both an alpha-amino carboxylic acid functional group and an additional amino functional group is lysine. Arginine is an example of a compound having both an alpha-amino carboxylic acid functional group and an additional guanidine substituent. In one embodiment the additive compound is selected from the group consisting of arginine, lysine and lysine monohydrochloride. Illustrative useful compounds are listed below.

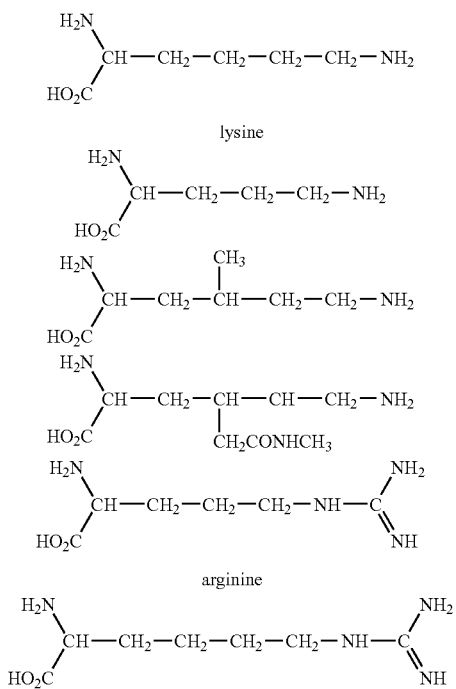

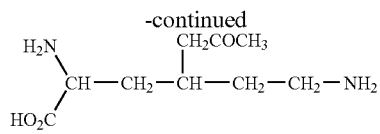

An amount of one or more pH adjusters such as potassium hydroxide or perchloric acid, for example, can be added to adjust the pH of the polishing solution to a range of from about 8 to 11, and more preferably from about 9 to about 10. Potassium hydroxide is the preferred pH adjuster for use with lysine monohydrochloride and perchloric acid is the preferred pH adjuster for use with lysine and arginine.

The colloidal silica particles used in the polishing slurry according to the invention preferably have a mean average diameter of from about 25 nm to about 75 nm, and more preferably of about 50 nm. The calcined ceria particles used in the polishing slurry according to the invention preferably have a mean average diameter of from about 170 nm to about 250 nm. It will be appreciated that is the physical dimensions of the abrasive particles are not per se critical, and that other particle sizes can be used in accordance with the invention.

The additive is preferably present in an amount from about 1.0% to about 4.0% by weight, and more preferably, from about 1.0% to about 2.0% by weight. Arginine is presently most preferred, but lysine, either in its free base form (sometimes simply referred to as lysine or L-lysine) or its monohydrochloride salt form, can also be used. Lysine monohydrochloride is preferred over the free base form of lysine in view of cost.

Picolinic acid or a derivative thereof can optionally be added. In one embodiment, optionally added amounts of picolinic acid or a derivative thereof are from about 1.0% to about 3.0%.

Useful derivatives of picolinic acid include compounds of formula 1, wherein $r_1$-$r_4$ independently represent hydrogen or a substituent such as, for example, a substituted or unsubstituted alkyl group, such as a methyl or ethyl group, a halogen, such as a chloro group, or a substituted or unsubstituted aromatic group such as a phenyl group. In one desirable embodiment, $r_1$-$r_4$ represent hydrogen and formula 1 represents picolinic acid.

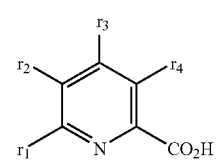

Zeta potential and FTIR measurements of slurry particles and surfaces in the presence of the additives confirm that adsorption of the additives occurs on the abrasive particles in the polishing slurry and on the silicon dioxide and silicon nitride film surfaces. The presence of the adsorbed additive on the abrasive particles and the silicon dioxide and silicon nitride film surfaces causes electrostatic repulsion of the abrasive particles from the silicon dioxide and/or silicon nitride surfaces, which results in the suppression of the silicon dioxide and/or silicon nitride removal rate without adversely affecting the rate at which polysilicon is removed.

The following examples are intended to illustrate the invention without limiting it in any way. All raw materials referenced in the examples are standard pigment grade powders unless otherwise indicated.

COMPARATIVE EXAMPLE 1

Five CMP slurries were separately prepared by dispersing 10% by weight of silica particles having a mean size of about 50 nm dispersed in water. An amount of potassium hydroxide or perchloric acid was added to each of the CMP slurries to adjust the pH to 3, 5, 7, 9 and 11, respectively.

The CMP slurries were then separately used to polish blanket polysilicon, silicon dioxide and silicon nitride films for one minute using a Westech-372 polisher using a down force of 4 psi, a carrier/platen speed of 75/75 rpm, a slurry flow rate of 200 ml/min and an IC-1400, k-groove polishing pad. FIG. 1 is a graph showing the removal rate in nm/min of each blanket film as a function of pH.

COMPARATIVE EXAMPLE 2

Figure 2:
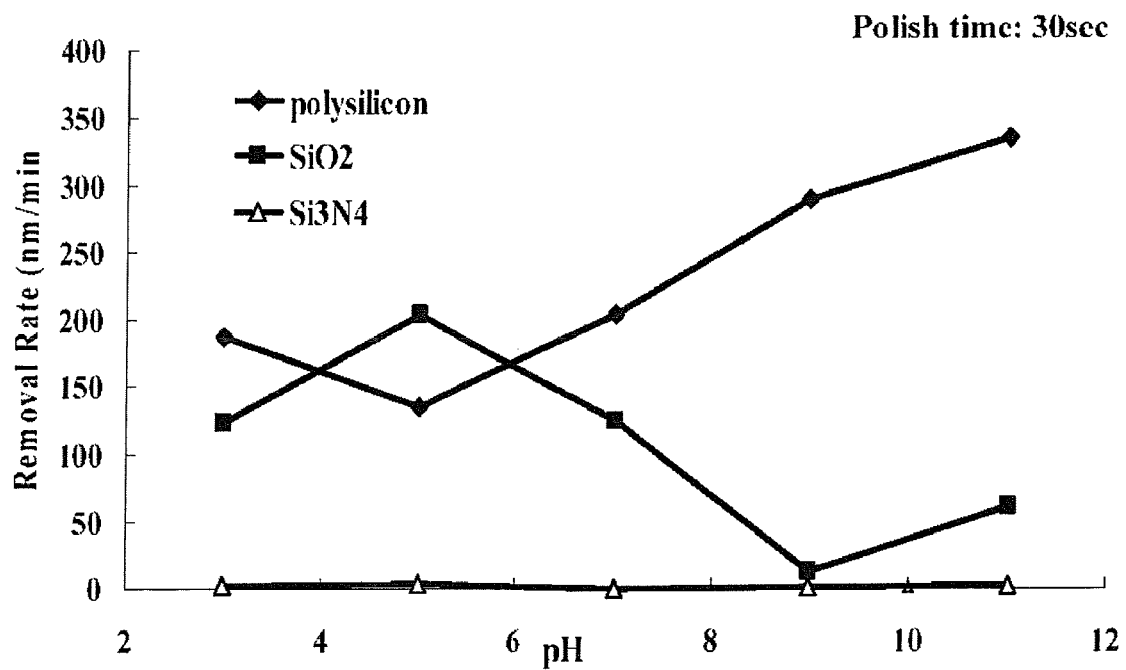
FIG. 2 is a graph showing the removal rate of blanket films using a comparative ceria CMP slurry as a function of pH.

Five more CMP slurries were separately prepared by dispersing 1% by weight of arginine followed by 1% by weight of calcined ceria particles having a mean size of about 200 nm dispersed in water to each of the slurries. An amount of potassium hydroxide or perchloric acid was added to the CMP slurries to adjust the pH to 3, 5, 7, 9 and 11, respectively. The CMP slurries were then used to polish blanket polysilicon, silicon dioxide and silicon nitride films for thirty seconds using exactly the same polishing conditions as in Comparative Example 1. FIG. 2 is a graph showing the removal rate in nm/min of each blanket film as a function of pH.

FIGS. 1 and 2 show that at a pH of from about 8 to about 10, the polysilicon removal rates are high while the silicon dioxide and silicon nitride removal rates are <50 nm/min and <15 nm/min respectively. Thus, additives were used with silica and ceria slurries to further suppress the silicon dioxide and silicon nitride removal rates in the pH range of from about 8 to about 10.

EXAMPLE 3

Eight CMP slurries (3A through 3H) were separately prepared by dispersing 10% by weight of silica particles having a mean size of about 50 nm dispersed in water. The additives listed in Table 1 below in weight percent were added to the respective CMP slurries (where "Arg" means arginine; "LysHCl" means lysine monohydrochloride; "Gly" means glycine; "Hist" means histidine; and "Pico" means picolinic acid). The pH of the CMP slurries was adjusted as shown in Table 1 below by adding a sufficient amount of potassium hydroxide for the slurries containing lysine monohydrochloride, glycine and histidine, and by adding perchloric acid for the slurries containing arginine. The CMP slurries were then used to polish blanket polysilicon, silicon dioxide and silicon nitride films for one minute using exactly the same polishing conditions as in Comparative Example 1. At least two wafers each of silicon dioxide and silicon nitride were polished, but only one polysilicon wafer was polished. The average removal rate results are shown in Table 1 below (where "RR" means removal rate in nm/min):

TABLE 1

| Sample | pH | Additive | Poly-Si RR | SiO$_2$ RR | Si$_3$N$_4$ RR | Selectivity Poly-Si:SiO$_2$ | Selectivity Poly-Si:Si$_3$N$_4$ |
|---|---|---|---|---|---|---|---|
| 3A | 10 | Arg - 1 wt % | 289 ± 43 | 3 ± 2 | 1 ± 0.4 | ~96 | 289 |
| 3B | 10 | Arg - 2 wt % | 514 ± 87 | 4 ± 3 | 2 ± 1 | ~129 | 257 |
| 3C | 9 | LysHCL - 1 wt % | 374 ± 43 | 8 ± 3 | 24 ± 4 | ~47 | ~16 |
| 3D | 9 | LysHCL - 2 wt % | 375 ± 41 | 6 ± 5 | 16 ± 5 | ~63 | ~23 |
| 3E | 10 | Arg - 3 wt % Pico - 1 wt % | 542 ± 67 | 7 ± 3 | 8 ± 2 | ~77 | ~68 |
| 3F | 10 | Pico - 1 wt % | 487 ± 129 | 41 ± 19 | 18 ± 6 | ~12 | ~27 |
| 3G | 10 | Gly - 1 wt % | 625 ± 155 | 47 ± 16 | 19 ± 5 | ~13 | ~33 |
| 3H | 10 | Hist - 1 wt % | 310 ± 64 | 50 ± 23 | 9 ± 5 | 6 | 34 |

Table 1 shows that the addition of arginine and lysine monohydrochloride to the colloidal silica slurries increased the polysilicon film polish rates but suppressed the silicon dioxide film polish rates. Arginine suppressed the silicon nitride film polish rate also in colloidal silica slurries, while lysine monohydrochloride increased the silicon nitride film polish rate when used with colloidal silica abrasives. CMP slurry 3B, in particular, exhibited a very high removal rate for polysilicon (514±87 nm/min) as well as very high selectivity with respect to silicon dioxide (~129) and silicon nitride (~257).

The additives in slurries 3E, 3F and 3G enhanced the polysilicon removal rates to as high as >450 nm/min but the selectivity over silicon dioxide and silicon nitride criterion to be >=50 was met only by 3E. The CMP slurry containing histidine was also not as selective for polysilicon as the CMP slurries containing arginine or lysine monohydrochloride.

EXAMPLE 4

Five CMP slurries (4A through 4E) were separately prepared by dispersing 1% by weight of calcined ceria particles having a mean size of about 200 nm dispersed in water. The additives listed in Table 2 below in weight percent were added to the respective CMP slurries (where "Arg" means arginine; and "LysHCl" means lysine monohydrochloride. The pH of each of the CMP slurries was adjusted to 9 by adding a sufficient amount of perchloric acid to the arginine-based slurries and potassium hydroxide to the lysine monohydrochloride-based slurries.

The CMP slurries were then used to polish blanket polysilicon, silicon dioxide and silicon nitride films for one minute using exactly the same polishing conditions as in Comparative Example 1. At least two wafers each of silicon dioxide and silicon nitride were polished, but only one polysilicon wafer was polished. The average results are shown in Table 2 below (where "RR" means removal rate in nm/min):

TABLE 2

| Sample | Additive | Poly-Si RR | $SiO_2$ RR | $Si_3N_4$ RR | Selectivity Poly-Si:$SiO_2$ | Selectivity Poly-Si:$Si_3N_4$ |
|---|---|---|---|---|---|---|
| 4A | None | 76 ± 16 | 460 ± 40 | 117 ± 2 | 0.16 | 0.65 |
| 4B | Arg - 1 wt % | 537 ± 83 | 38 ± 27 | 2 ± 1 | ~14 | ~269 |
| 4C | Arg - 2 wt % | 412 ± 100 | 23 ± 6 | 2 ± 1 | ~18 | 206 |
| 4D | LysHCl - 1 wt % | 99 ± 53 | 33 ± 16 | 3 ± 2 | 3 | 33 |
| 4E | LysHCl - 2 wt % | 554 ± 107 | 11 ± 7 | 2 ± 1 | ~50 | 277 |

Table 2 shows that both arginine and lysine monohydrochloride when used with ceria abrasives, enhanced the polysilicon film polish rate and suppressed the silicon dioxide and silicon nitride film polish rates. CMP slurry 4E, in particular, exhibited a very high removal rate for polysilicon (554±107 nm/min) as well as very high selectivity with respect to silicon dioxide (~50) and silicon nitride (~277).

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed is:

1. A method for selectively removing polysilicon from a surface in preference to silicon dioxide and/or silicon nitride, the method comprising:
    a) providing a polishing slurry having a pH of from about 8 to about 11 that comprises colloidal silica abrasive particles dispersed in water and an additive compound selected from the group consisting of lysine, lysine monohydrochloride and arginine;
    b) disposing the polishing slurry between a polishing pad and the surface; and
    c) pressing the polishing pad and the surface into contact with each other while the polishing pad and surface are moving relative to each other with the polishing slurry disposed therebetween to remove polysilicon from the surface at a removal rate of 100 nm/min or greater while maintaining a selectivity ratio of polysilicon to silicon dioxide and/or of polysilicon to silicon nitride of 30 or greater.

2. The method according to claim 1 wherein said removal rate is 200 nm/min or greater.

3. The method according to claim 1 wherein said selectivity ratio is 50 or greater.

4. The method according to claim 1 wherein the polishing slurry comprises from about 5% to about 15% by weight of said colloidal silica abrasive particles, and wherein said colloidal silica abrasive particles have a mean average diameter of from about 25 nm to about 75 nm.

5. The method according to claim 1 wherein the polishing slurry comprises from about 1.0% to about 4.0% by weight of arginine.

6. The method according to claim 1 wherein the polishing slurry comprises from about 1.0% to about 2.0% by weight of lysine.

7. The method according to claim 1 wherein the polishing slurry further comprises picolinic acid or a derivative thereof.

8. The method according to claim 1 wherein the polishing slurry comprises about 10% by weight of colloidal silica abrasive particles having a mean average diameter of about 50 nm and from about 1% to about 3% by weight of arginine.

9. A method for selectively removing polysilicon from a surface in preference to silicon dioxide and/or silicon nitride, the method comprising:
    a) providing a polishing slurry having a pH of from about 8 to about 11 that comprises
        i) from about 5% to about 15% by weight of colloidal silica abrasive particles having a mean average diameter of from about 25 nm to about 75 nm dispersed in water,
        ii) from about 1% to about 3% by weight of arginine, and
        iii) about 1% by weight of picolinic acid;
    b) disposing the polishing slurry between a polishing pad and the surface; and
    c) pressing the polishing pad and the surface into contact with each other while the polishing pad and surface are moving relative to each other with the polishing slurry disposed therebetween to remove polysilicon from the surface at a removal rate of 100 nm/min or greater while maintaining a selectivity ratio of polysilicon to silicon dioxide and/or of polysilicon to silicon nitride of 30 or greater.

10. A method for selectively removing polysilicon from a surface in preference to silicon dioxide and/or silicon nitride, the method comprising:
    a) providing a polishing slurry having a pH of from about 8 to about 11 that comprises calcined ceria abrasive particles dispersed in water and an additive compound, wherein said additive compound is selected from the group consisting of lysine, lysine monohydrochloride and arginine;
    b) disposing the polishing slurry between a polishing pad and the surface; and c) pressing the polishing pad and the surface into contact with each other while the polishing pad and surface are moving relative to each other with the polishing slurry disposed therebetween to remove polysilicon from the surface at a removal rate of 100 nm/min or greater while maintaining a selectivity ratio of polysilicon to silicon dioxide and/or of polysilicon to silicon nitride of 30 or greater.

11. The method according to claim 10 wherein said removal rate is 200 nm/min or greater.

12. The method according to claim 10 wherein said selectivity ratio is 50 or greater.

13. The method according to claim 10 wherein said additive compound is lysine or lysine monohydrochloride.

14. The method according to claim 10 wherein the polishing slurry comprises from about 0.5% to about 1.5% by weight of said calcined ceria abrasive particles, and wherein said calcined ceria abrasive particles have a mean average diameter of from about 170 nm to about 250 nm.

15. The method according to claim 10 wherein the polishing slurry comprises from about 1.0% to about 2.0% by weight of lysine monohydrochloride.

16. The method according to claim 10 wherein the polishing slurry comprises about 1% by weight of calcined ceria abrasive particles having a mean average diameter of about 200 nm and from about 1% to about 2% by weight of lysine monohydrochloride.

* * * * *